United States Patent [19]

Misawa et al.

[11] Patent Number: 4,465,379

[45] Date of Patent: Aug. 14, 1984

[54] TEMPERATURE DETECTOR CIRCUIT FOR TIMEPIECE

[75] Inventors: Toshiyuki Misawa; Tatsushi Asakawa, both of Suwa, Japan

[73] Assignee: Kabushiki Kaisha Suwa Seikosha, Tokyo, Japan

[21] Appl. No.: 152,448

[22] Filed: May 22, 1980

[30] Foreign Application Priority Data

May 23, 1979 [JP] Japan ................................. 54-64151
Jun. 19, 1979 [JP] Japan ................................. 54-77216
Sep. 28, 1979 [JP] Japan ................................. 54-126100

[51] Int. Cl.³ .......................... G04B 17/12; H03L 1/00
[52] U.S. Cl. ..................................... 368/202; 331/176
[58] Field of Search .......................... 368/87, 155–156, 368/186, 200–202, 218–219; 331/176; 330/253

[56] References Cited

U.S. PATENT DOCUMENTS

| 3,719,838 | 3/1973 | Peduto et al. | 331/116 R |
| 3,999,370 | 12/1976 | Morokawa et al. | 368/202 |
| 4,001,721 | 1/1977 | Fukuda | 331/176 X |
| 4,015,208 | 3/1977 | Hammer et al. | 331/176 |
| 4,020,426 | 4/1977 | Hellé | 331/176 X/ |
| 4,048,575 | 9/1977 | Musa | 330/253 |
| 4,072,912 | 2/1978 | Pradal | 331/176 X |
| 4,094,137 | 6/1978 | Morokawa | 368/200 |
| 4,272,840 | 6/1981 | Morozumi et al. | 368/202 |
| 4,298,971 | 11/1981 | Morokawa et al. | 368/204 |

FOREIGN PATENT DOCUMENTS 44-11071 5/1969 Japan ................................. 331/176

Primary Examiner—Vit W. Miska
Attorney, Agent, or Firm—Blum Kaplan Friedman Silberman & Beran

[57] ABSTRACT

A circuit for compensation of timekeeping inaccuracies induced by ambient temperature variations. A bridge circuit having a temperature sensitive resistive element in one branch and a resistance of programmed variation in the other branch outputs a changing unbalanced voltage to drive a comparator. A change in polarity of the comparator output detects the ambient temperature and causes a counter controlling the programmed resistance to output signals to a timekeeping regulation circuit whereby timekeeping is made accurate. Initial corrections are made in the programmed resistance branch to adjust for off-design performance of the vibrator in the timepiece oscillator.

36 Claims, 20 Drawing Figures

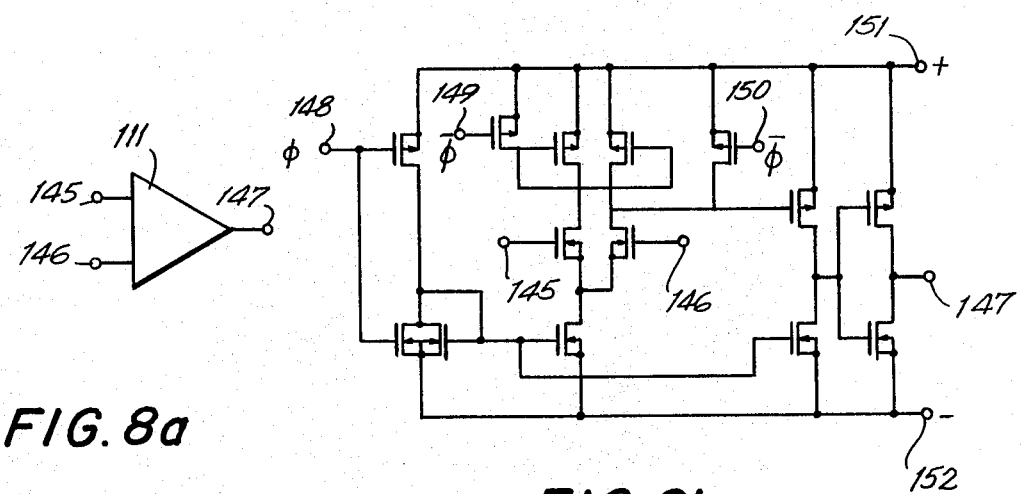
FIG. 8a
FIG. 8b
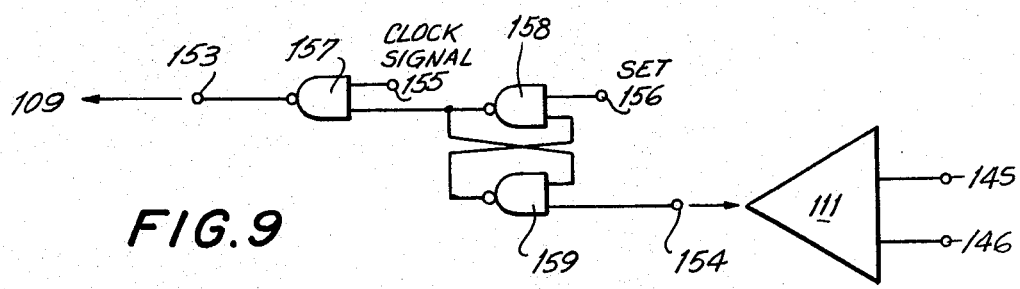
FIG. 9
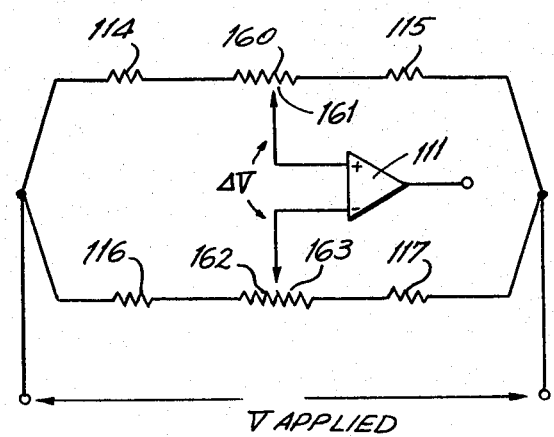
FIG. 10

TEMPERATURE DETECTOR CIRCUIT FOR TIMEPIECE

BACKGROUND OF THE INVENTION

This invention relates generally to a temperature dectector circuit of the type used in small sized electronic timepieces for correction of inaccuracies in timekeeping and more particularly to a temperature detector circuit using intergrated resistors. This invention relates to a temperature detector circuit using the temperature sensitive characteristics of a resistor. Conventionally, such a thermo-sensitive device, for example, a thermistor, is used in a temperature detecting system which relies on the temperature characteristics of the resistor. In such a system there is the advantage that the sensitivity to temperature is very good because of the large temperature coefficient of that type of resistor. On the other hand, there is the disadvantage that such a thermo-sensitive element must be provided separate from an intergrated circuit as when such a circuit is used to compensate for temperature induced variations in a quartz crystal oscillator of a timepiece with a liquid crystal display.

It is conventional, in electronic timepieces to utilize a tuning-fork quartz crystal vibrator operating in a flexural mode and having a resonant frequency of 32.678 KHz. Such a tuning-fork type vibrator is widely used especially in watches because this vibrator can easily be manufactured in small size which is suitable to a timepiece for the wrist. However, a tuning-fork type quartz crystal vibrator has deficiencies in that the temperature characteristic is poor and changes in oscillating frequency due to aging are significant. In order to overcome these deficiencies, a titanic acid barium condenser which has a similar temperature characteristic to the quartz cyrstal vibrator, or two quartz crystal vibrators are used together so as to meet the desired timekeeping accuracy specification.

Unfortunately, these methods require too many steps in compensation and require that the titanic acid barium condenser or the supplemental quartz crystal be very narrowly specified for suitable performance. Also these elements need to be set outside of the intergrated circuit of the timepiece such that production efficiency is significantly reduced and costs are increased. Further, the number of components which are set apart from the intergrated circuit is a factor which prevents a timepiece from being made in a small size and with a good appearance design.

What is needed is a temperature detector circuit for a timepiece which is highly sensitive in performance and is formed as part of the intergrated circuitry associated with the timepiece and requires no externally attached components.

SUMMARY OF THE INVENTION

Generally speaking, in accordance with the invention, a temperature detector circuit for a timepiece having high sensitivity and using intergrated temperature sensitive components is provided. In the temperature detector circuit of this invention, a bridge circuit having a temperature sensitive resistive element in one branch and a resistance of programmed variation in the other branch outputs a changing unbalanced voltage to drive a comparator. A change in polarity of the comparator output detects the ambient temperature and causes a counter controlling the programmed resistance to output signals to a timekeeping regulation circuit whereby timekeeping is made accurate. Initial corrections are made in the programmed resistance branch to adjust for off-design performance of the vibrator in the timepiece oscillator. An involatile memory element of the PROM type is used for the initial adjustment.

A pair of temperature resistors are used to increase the sensitivity of the circuit to temperature changes and another memory element is used to calibrate the temperature sensitive resistance elements to the characteristics of the timepiece.

Accordingly, it is an object of this invention to provide an improved temperature detector circuit for a timepiece having its elements in an integrated circuit, preferably on the same chip as used for the circuits of the timepiece.

Another object of this invention is to provide an improved temperature detector circuit for a timepiece which is initially adjustable for variations in the oscillator element attributable to production tolerances.

A further object of this invention is to a provide an improved temperature detector circuit for a timepiece which has a greater sensitivity to temperature changes than does a single resistive element.

Still another object of this invention is to provide an improved temperature detector circuit for a timepiece which uses integrated resistive elements which are formed on a substrate during conventional process steps used in forming other circuit elements on the substrate.

Yet another object of this invention is to provide an improved temperature detector circuit for a timepiece wherein initial adjustments are made for variations in production of the timepiece vibrator element and for variations in production of the temperature sensitive resistive elements by intergrated circuit techniques.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, references had to the following description taken in connection with the accompanying drawings, in which:

FIGS. 6–9 are more detailed circuit drawings of functional blocks shown in FIG. 5;

FIG. 10 is a circuit drawing used in explaining the temperature compensation system in accordance with this invention, using resistors having different temperature coefficients;

DESCRIPTION OF THE PREFERRED EMBODIMENTS

Figure 1:
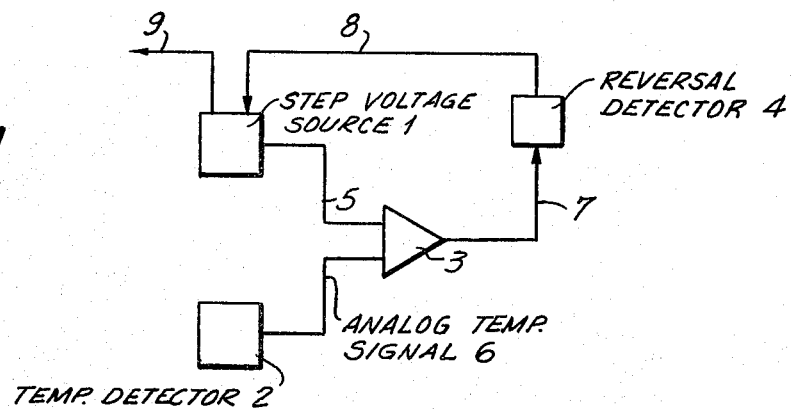
FIG. 1 is simplified functional block diagram of a temperature detector circuit in accordance with this invention.

Initially, a temperature detector in accordance with this invention is explained with reference to FIGS. 1-3. In the temperature detector circuit of FIG. 1, the reference numeral 5 represents a signal outputted by a step voltage source 1. The output signal 5 changes in magnitude step by step and responds to the count of a counter (not shown) within the step voltage source 1. A circuit 2 is used to produce an analog output signal 6 which changes in accordance with the surrounding ambient temperature. The output signals 5,6 are inputted to a comparator 3 which outputs a signal 7. When the signal from the step voltage source 1 is greater than the signal 6 from the temperature sensitive circuit 2, the comparator 3 outputs a signal 7 of a given polarity. The signal 5 decreases in steps as stated above such that when the signal 6 exceeds the voltage level of the signal 5 the polarity of the signal output 7 of the comparator 3 is reversed. A circuit 4 detects the reversal in the signal 7 and upon such a reversal outputs a signal 8 to the step voltage source 1. The signal received in the step voltage source 1 stops the counter within the voltage source 1 such that the voltage of the signal 5 remain stable. In this way the count accumulated by the counter (not shown) within the voltage source 1 provides output signals 9 which are representative of a given temperature as sensed by the detector 2 and outputted as an analog voltage signal 6.

In a typical embodiment of this invention, the voltage level of the signal 5 is independent of the surrounding temperature and as explained more fully hereinafter, changes only in response to the counter output of the step voltage source 1. Only the voltage level of the signal 6 is dependent on the surrounding temperature. However, as will be apparent, this is not a required construction. It is only necessary that the signal 5 or the signal 6 be changed dependent on the ambient temperature.

Figure 2:
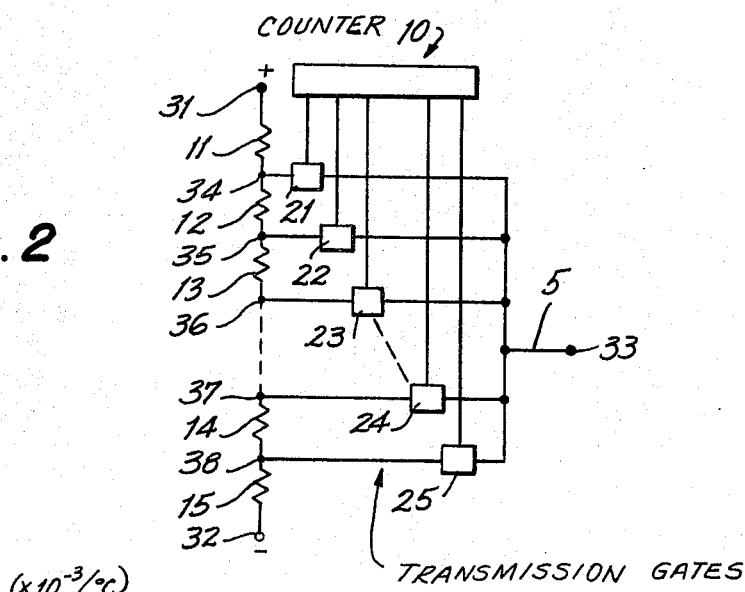
FIG. 2 is a circuit for producing voltage steps in the temperature detector circuit of FIG. 1.
Figure 3:
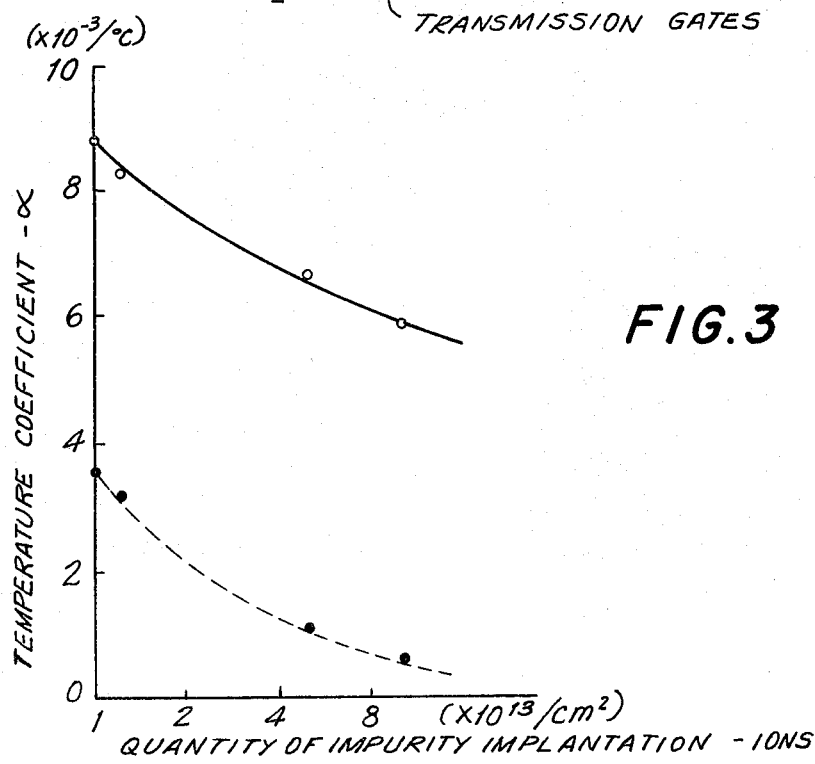
FIG. 3 is a graph showing the relationship between the resistive temperature coefficient and the implantation impurity of an intergrated resistor element.

An embodiment of a step voltage source circuit 1 is shown in FIG. 2. The circuit includes a counter 10 and series intergrated resistors 11-15. Transmission gates 21-25 are connected to the nodal points 34-38 between the resistors 11-15. The outputs of the gates 21-25 are connected to a common line 33 which in FIG. 1 carries the signal 5. The series resistors are connected across a DC power source with resistor 11 connected to the positive terminal 31 and the resistor 15 connected to the negative terminal 32.

The counter 10 causes each transmission gate 21-25 to close in turn such that the voltage at the output 33 becomes progressively less positive with each count of the counter. Thus, the circuit of FIG. 2 provides the step voltage output signal 5 of FIG. 1. It should be understood that the resistors are sized such that the voltage steps which are produced correlate with the voltage signal 6 produced by the temperature detector 2 in order to produce a change in polarity in the output of the comparator 3 when the changing voltage passes through a point of equality with the signal from the temperature detector 2.

The formula (1) is generally used to represent a resistance where R is the resistance value; L is the length of the resistor; the cross-sectional area of the resistor is S, and resistivity is represented by the Greek letter $\rho$.

$$R = \rho \frac{L}{S}$$

In order to obtain resistors of high quality, that is resistors 11-15, it is necessary to manufacture the resistors on the basis that the value of $\rho$ is small and the length L is large. The resistors may be formed on a substrate as a diffused resistor of high impurity density during the process of forming the source and drain for transistors on the same substrate. Or, the resistors may be manufactured as polycrystalline silicon resistors during the process for forming a gate of a MOS transistor which is formed of polycrystalline silicon.

It can be anticipated that the resistance value of a resistor formed in an intergrated circuit as stated above will show variations of 10 to 20 percent between each manufactured lot and there are variations between each wafer and between each chip which is manufactured. These variations are caused by sheet resistivity variances in forming the resistors and by a difference between the actual size of the resistor and the design value of the resistor due to a lack of or excess of etching, or variation in other steps of producing the integrated resistors. Therefore, a circuit for compensating for these variations is required in the circuit blocks 1,2 of FIG. 1 wherein the integrated circuits are utilized. Diffused resistors of high impurity density or polycrystalline silicon resistors may also be used as a means for proper compensation of the variations in the temperature sensitive element of the temperature detector to and for the resistances 11-15 of FIG. 2.

Also, a plurality of resistors having different temperature coefficients are used as the means for obtaining a signal 6 having a voltage level which changes dependent on the ambient temperature. For example, in FIG. 1, when the step voltage source 1 is constructed such that the output signal 5 is independent of the ambient temperature, then only the voltage level of the signal 6 from the temperature detector 2 is made dependent on the surrounding temperature. In such a case two resistors of different temperature coefficients $\alpha$ and $\beta$ are used in the temperature detector 2. In using such a construction, the larger the difference between the co-efficients $\alpha$ and $\beta$, the larger is the change in the signal 6 as a result of changes in the ambient temperature.

To obtain a large difference between the temperature co-efficients combinations are made between a diffused resistor of low impurity density or an ion implanted resistor of low impurity density with a diffused resistor of high impurity density or a polycrystalline silicon resistor of high impurity density. Generally, the lower impurity density produces a resistor of lower temperature coefficient. It must be noted that the resistors used for the above combinations can be made in the regular manufacturing process of intergrated circuits, without any particular steps for making the resistors used in the temperature detector 2 for temperature detection. Specifically, a resistance of low purity density is made in the same process for making a P-type well. A diffused resistor of high impurity density is made in the same process used for making the drain and the source of a transistor, and a polycrystalline silicon resistor is made in the same process used for making the polycrystalline silicon gate of a MOS transistor having such a gate. A resistor made by the ion implantation techniques has a different depth of diffusion in accordance with the degree of heat treatment used after the ion implantation. Therefore, impurity densities in the bulk surfaces are different according to the condition of the heat treatment even though the quantity of impurity implantation may equal. Thus, the temperature coefficients are different as desired.

Resistors having a different depth of diffusion can be used as the two resistors having different temperature coefficients alpha and beta ($\alpha$ and $\beta$) in the temperature detector 2. Variations of the temperature coefficients in accordance with the conditions of heat treatment and the difference in the amount of impurity implantation is shown using measured data in FIG. 3. The solid line of FIG. 3 shows the characteristics of a resistor having ions implanted during the process for forming a P-type well of low impurity density. The broken line of FIG. 3 shows the characteristics of a resistor formed by ion implantation in the same process following formation of a gate insulator for a MOS transistor. It should be noted that the temperature coefficient of a resistor of high impurity density made during the process for forming the drain and source of a transistor has temperature coefficient values in the order of $10^{-4}$ as compared to the $10^{-3}$ shown in FIG. 3.

Accordingly, when using a temperature detector circuit in accordance with this invention, the temperature detector circuit can be completely integrated in the same processes as used in the manufacture of the conventional intergrated circuit. A temperature detector circuit in accordance with this invention can be provided for a timepiece on the same intergrated circuit substrate as used for timekeeping and for driving a liquid crystal display, and for other supplemental circuits. All this can be accomplished on one intergrated circuit chip such that in a timepiece the temperature dependence of the oscillation frequency of the quartz crystal vibrator and therefore the temperature dependence of the liquid crystal display are compensated. Moreover, the cost for manufacture of this temperature detection circuit is low. Further, this temperature detector circuit is not only suitable for application to a timepiece, but also may be broadly applied to control the temperature of domestic electric products and to control industrial devices and processes. Also, this invention can be adapted to a small sized thermometer of high quality.

Figure 4:
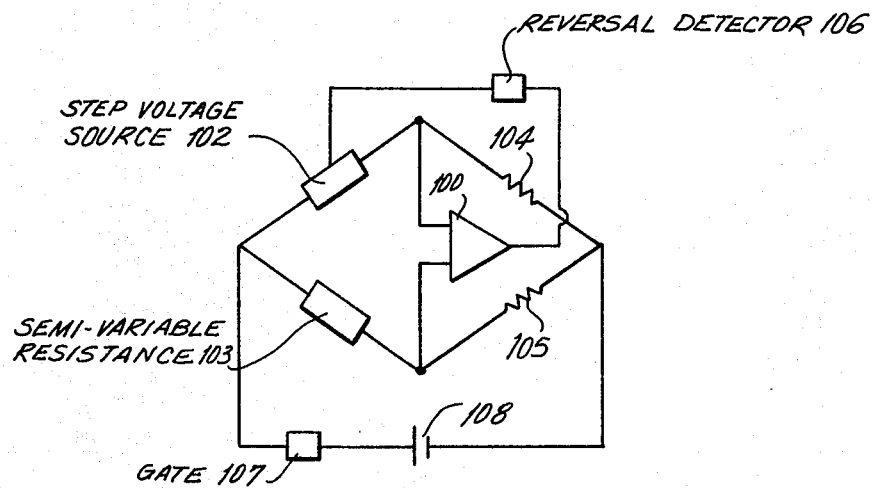
FIG. 4 is a functional block diagram of a temperature detector circuit in accordance with this invention, similar to FIG. 1.

FIG. 4 is a circuit diagram of a temperature detector similar to FIG. 1 but providing additional details of construction. Basically, the circuit is a bridge circuit with a comparator 100 detecting an imbalance in the voltages between the branches of the bridge circuit. The bridge circuit includes a variable resistor/counter 102, which in accordance with the count of the counter changes proportioning of the resistance which is in that branch of the bridge circuit. The circuit block 102 of FIG. 4 corresponds to the circuit of FIG. 2 and to the step voltage source 1 of FIG. 1. A fixed resistor 104 is in series with the resistor/counter 102. In the other branch of the bridge there is the temperature sensitive element 103 in series with a fixed resistor 105. The temperature sensitive element 103 includes a semifixed resistance for initially adjusting variations in resistance value of the integrated circuit elements by using a PROM or a fuse as discussed more fully hereinafter. The temperature detector 2 of FIG. 1 corresponds to the semi-variable resistance temperature element 103 of FIG. 4. The comparator 100 senses the voltage difference at the nodes between the branch elements. The comparator 100 corresponds to the comparator 3 of FIG. 1. A reversal detector 106, corresponding to the reversal detector 4 of FIG. 1, detects a reversal in polarity or level of the output of the comparator 100 as the counter changes the resistance of the element 102 step by step. When the output of the comparator 100 reverses, a reversal detector 106 outputs a signal which stops the counter within the resistor/counter 102. A transmission gate 107 is in series with a DC power source 108 across the ends of the branches of the bridge circuit. However, when a transmission gate is used for constructing the variable resistor/counter 102 or the semi-variable resistor 103 in the temperature detector circuit of FIG. 4, the current flows through the transmission gate. Thus, a problem arises in that the impedance of the transmission gate must be taken into consideration and the transmission gate changes dependent on the ambient temperature, and the transmission gate ages and changes impedance, and so on.

The temperature detector circuit in accordance with this invention resolves the above cited deficiencies by connecting a terminal of the transmission gate used in the constructions of the variable resistor/counter 102 and the semi-fixed resistor 103 with a gate of a field effect transistor in the comparator 100 as discussed hereinafter.

Figure 5:
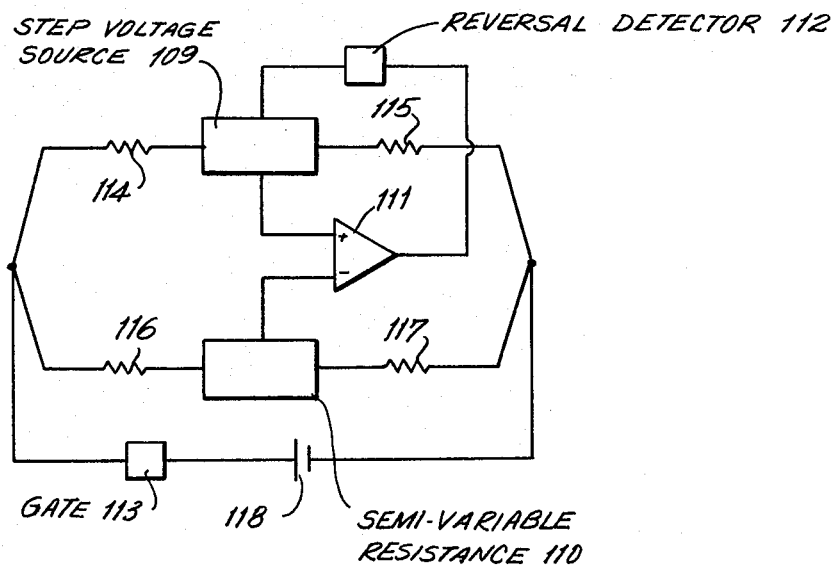
FIG. 5 is similar to FIG. 4 and showing greater circuit detail.
Figure 6:
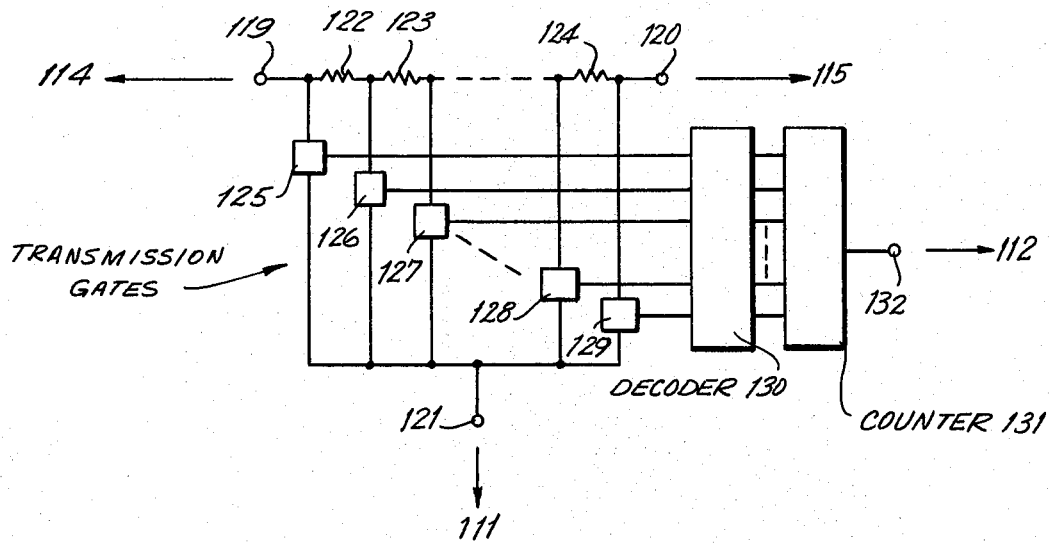

FIG. 5 is a more detailed circuit drawing of a temperature detector circuit in accordance with this invention. Resistors 114–117 are integrated and independent of temperature variations. A variable resistor 109 is positioned between fixed resistors 114 and 115 and the variable resistor 109 is shown by the circuit of FIG. 6. A semi-variable resistor 110 is in the other branch of the bridge circuit between the fixed resistors 116, 117 and the semi-variable resistor 110 is shown in greater detail in FIG. 7. A comparator 111 measures the imbalance between the bridge circuit branches and outputs a difference signal to the reversal detector 112. When the polarity of the signal outputted by the comparator 111 reverses in state or polarity, the reversal detector 112 outputs a signal for stopping the counting of a counter included in the variable resistance element 109 as described above. The bridge is connected across a DC power source 118 through a transmission gate 113. A detailed circuit of the comparator 111 is presented in FIG. 8 and a detailed circuit drawing of the reversal detector 112 is presented in FIG. 9. The circuit of FIG. 5 is similar to the circuit of FIG. 4 except for the addition of fixed resistors 114, 116 in the bridge branches.

In FIG. 6, integrated resistors 122–124 are connected in series and transmission gates 125–129 are connected to the nodes in the series arrangement of resistors 122–124. A counter 131 feeds its output to a decoder 130 outputting signals which, in turn, close the transmission gates 125–129 such that the voltage at the terminal 121 varies step by step as described above. Terminals 119, 120 of FIG. 6 connect respectively to resistors 114, 115 of FIG. 5. Terminal 121 is connected to the plus input of the comparator 111 in FIG. 5 and terminal 132 of the counter 131 receives the stop signal from the reversal detector 112 which indicates a change in state or polarity of the output of the comparator 111 and stops the count of the counter 131.

Figure 7:
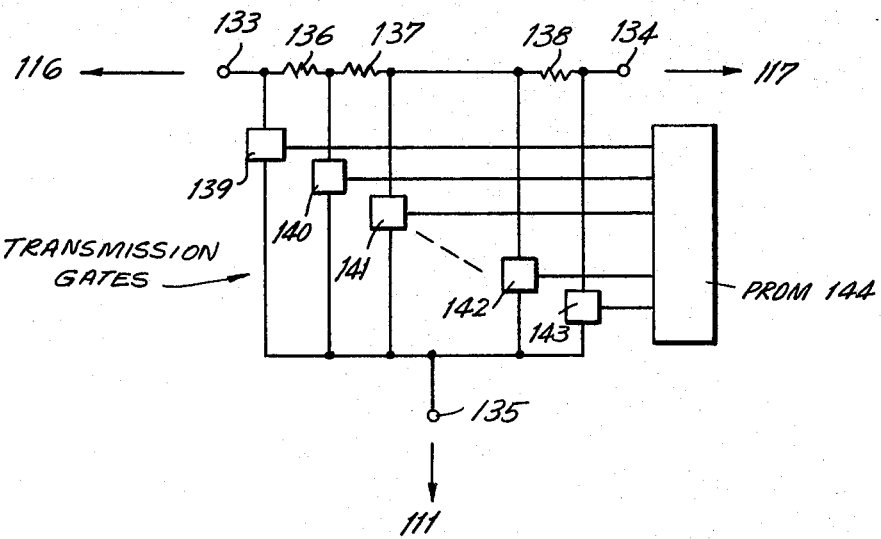

Details of the semi-variable resistance element 110 of FIG. 5 are shown in FIG. 7. Intergrated resistors 136–138 are in series and transmissions gates 139–143 are connected to the end points of the resistors 136–138. A programmable read only memory 144, that is, a PROM, has its outputs connected to the control elements of the transmission gates 139–143 such that the semi-variable resistance 110 in FIG. 5 can be initially adjusted to have the desired value and output in the circuit under design conditions. After the initial settings of the PROM 144 and value of the resistance of the circuit of FIG. 7 is fixed except for its dependence on the ambient temperature. Terminals 133, 134 and 135 of FIG. 7 correspond to the ends of resistors 116, 117 and the negative input of the comparator 111 respectively.

FIGS. 8a and 8b show an operational amplifier corresponding to the comparator 111 of FIG. 5, and FIG. 8b is a detailed circuit of such an operational amplifier. The terminals 145–147 in FIG. 8a correspond to the terminals having the same reference numerals in FIG. 8b. Terminal 151 is the positive terminal of a DC power source and terminal 152 is the negative terminal of the DC power source. A signal $\phi$ is input to a terminal 148 for controlling the operation and non-operation of the operational amplifier. An opposite signal $\bar{\phi}$ is inputted to the terminals 149, 150 which are the gates of field effect transistors. The common terminal 121 (FIG. 6) of the transmission gates 125–129 are connected to the gate 145 of FIG. 8b, and the terminal 135 of FIG. 7 is connected to the gate 146 of FIG. 8b. The gates 145,146 are elements of CMOS transistors of the comparator, so that very little current flows through a transmission gate which is open and the current input to the comparator 111 barely has an effect in changing the impedance of the transmission gate.

FIG. 9 is a circuit corresponding to the reversal detector 112 of FIG. 5. The terminals 153, 154 are respectively connected to the variable resistance 109 and the output of the comparator 111 of FIG. 5. Terminal 155 is input with a clock signal from a counter (not shown) and terminal 156 receives a setting signal for the reset-set flip flop including NAND gates 158, 159 of the CMOS type. A reversal in state or polarity in the output of the comparator 111, presented at the input terminal 154 of the detector of FIG. 9 causes a signal to be delivered from the output of the NAND gate 157. This signal is input to the counter 131 of the variable resistor 109 (FIG. 6) to stop the changing of the voltage as previously described.

With reference to FIG. 5, at least one of the resistors 114–117 and resistors contained in the variable resistor 109 and in the semi-variable resistor 110 is required to have a different temperature coefficient from the others. For example, FIG. 10 is another circuit drawing similar to FIG. 5 and showing the variable resistor 109 of FIG. 5 as the variable resistor 160, 161, and the semi-variable resistor 110 of FIG. 5 as the variable resistor 162, 163.

Assume that the temperature coefficients of the resistors 114–117 are respectively $\alpha$, $\beta$, $\gamma$ and $\delta$ and the temperature coefficients of resistors 160–163 are $\theta$. The resistance values of resistors 114–117 are respectively R1, R2, R3 and R4 when the temperature t equals 0 (°C.). The resistance values of the resistors 160–163 are respectively r1, r2, r3 and r4 for the same temperature t equals 0. Using the well known equations for a bridge circuit, a differential input voltage $\Delta V$, which is applied to the comparator 111, is expressed as follows:

$$\Delta V = [\{R_1(1+\alpha t) + r_1(1+\theta t)\}\{R_4(1+\delta t) + r_4(1+\theta t)\} - \{R_3(1+\gamma t) + r_3(1+\theta t)\}\{R_2(1+\beta t) + r_2(1+\theta t)\}]/D$$

D is the denominator of the differential input voltage equation $\Delta V$, and D is always greater than zero.

As described above, the temperature t is detected by a reversal in sign of the differential input voltage $\Delta V$ in accordance with the programmed changing of the values r1 and r2. A change in the polarity of the differential input voltage $\Delta V$ causes a reversal in the output signal of the comparator 111. Many different magnitudes of temperature coefficients can be assumed. For example, when simultaneously $\alpha = \delta$ and $\alpha$ and $\delta \gg \beta$, $\gamma$, $\theta$, the sensitivity $(\delta \Delta V/\delta t)$ of the differential input voltage $\Delta V$ for temperature changes has a value between the coefficients $\alpha$ and $2\alpha$. Therefore the differential input voltage $\Delta V$ has changes proportionately greater than the temperature coefficients $\alpha$ of the resistors used for the sensor. The sensitivity of the differential input voltage $\Delta V$ can be changed in accordance with the combination of resistors which is used.

As previously stated, the entire temperature detector circuit can be formed as an integrated circuit which is part of the same chip used for the integrated circuits of a timepiece. The comparator 111 of the detector circuit is constructed of CMOS transistors and the detector circuit flows a current for only a short pulse determined by the count of a counter such that a temperature compensation is accomplished using very little current.

In the description herein, mention is made of resistance changes step by step in response to the counting of a counter. It should be noted that the actual integrated resistors are not changed as the output to the comparator is connected to different nodal points between resistances. However, in the bridge branch it is the proportion of resistance on either side of the nodal point connected to the comparator which is changed step by step by the counter.

Figure 11:
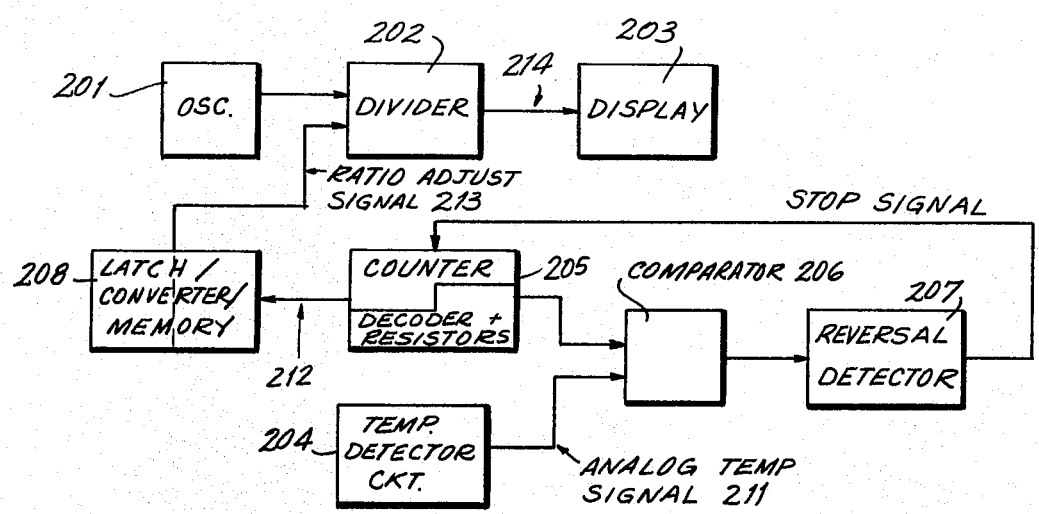
FIG. 11 is a functional block diagram similar to FIG. 1 and showing the interrelationship with the circuits of a timepiece.

FIG. 11 is a functional block diagram of a temperature detector circuit in accordance with this invention operating in an electronic timepiece. The timepiece includes an oscillator circuit 201 outputting a high frequency standard signal, a divider circuit 202 dividing down the high frequency standard signal and a display device 203. A temperature detector 204 outputs an analogue signal 211 which varies in response to the ambient temperature. The analogue signal 211 is inputted to a comparator 206 which has as its other input a voltage signal from a programmed variable resistor/counter 205 as previously described. When the output of the comparator 206 reverses in polarity, this change is detected by the reversal detector 207 which outputs a stop signal to the counter associated with the variable resistor and shown as the functional block 205. Thus, the analogue temperature signal 211 has become a digital stop signal to a counter. In the known manner, the conditions of the counter stages are read out as signals 212 which are fed to a converter 208. The converter 208 includes a memory in which is stored data representative of the corrections required to make the oscillator 201 accurate at selected ambient temperatures. The counter signals 212 are latched in the converter 208 and are compared with signals representing temperature which are stored in the memory. In other words, the count signals 212 are representative of the temperature detected by the circuit 204. Correction data is then selected from the memory and applied as signals 213 to the divider 202 of the timepiece circuitry. The controlling signals 213 adjust the division ratio of the divider circuit 202 and this is accomplished in accordance with the actual temperature detected by the detector 204 and the data stored in memory in the functional unit 208 to correspond with the actual temperature. As a result, an output signal 214 from the divider 202 is a timing signal of very high accuracy which has been corrected to be independent of temperature. It should be apparent that the functional blocks 204–207 of FIG. 11 correspond to the functional blocks 2,1,3 and 4 of FIG. 1. And the signal 212 of FIG. 11 corresponds to the signal 9 of FIG. 1.

Figure 12:
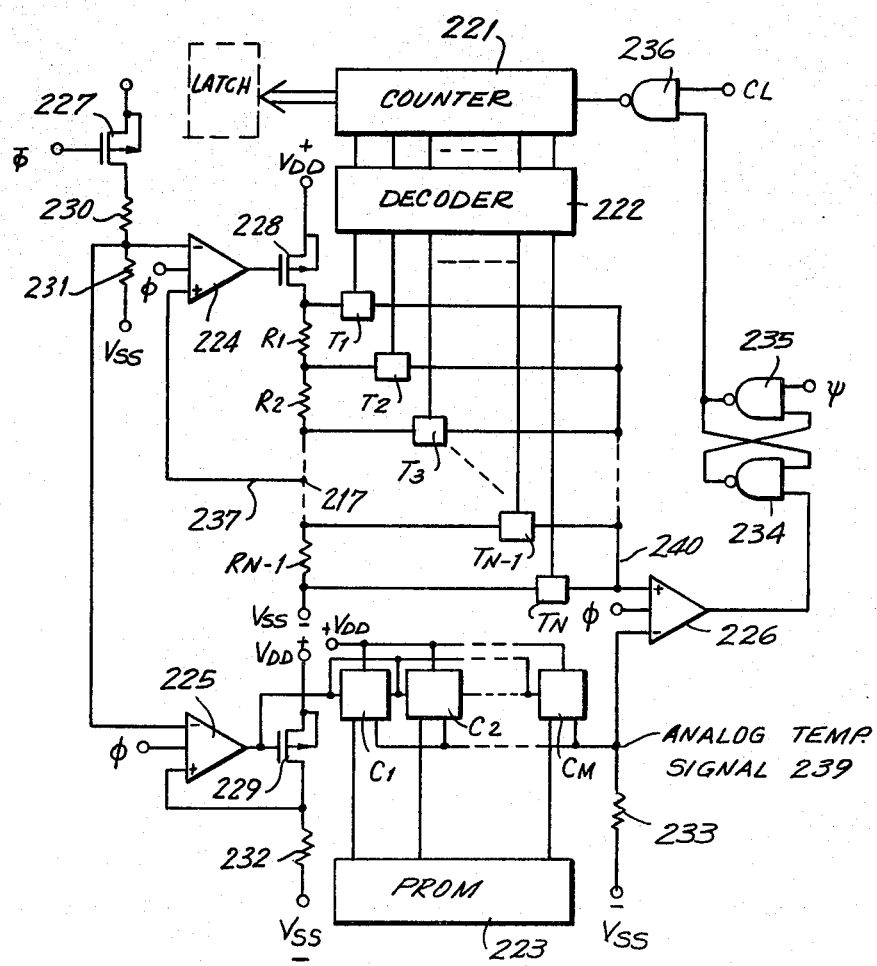
FIG. 12 is a circuit diagram of an alternative embodiment of a temperature detector circuit in accordance with this invention.

A detailed circuit of a portion of functional blocks 204–207 of FIG. 11 are shown in FIG. 12. Resistors $r_1$–$r_{N-1}$ are connected in series with a MOS field effect transistor (MOSFET) 228. All of these resistors $r_1$–$r_{N-1}$ have the same temperature coefficients. $T_1$–$T_N$ are analogue switches, for example, a transfer gate, or a transmission gate, and these switches $T_1$–$T_N$ connect to nodal points of the string of series resistors $r_1$–$r_{N-1}$. A counter 221 counts and its outputs are input to a decoder 222. The outputs of the decoder 222, one by one, close the analogue switches $T$–$T_N$ such that the voltage applied to the positive input of the comparator 226 varies step by step.

Resistors 230, 231 are arranged in series with a MOSFET 227 across a DC power supply. The nodal point between resistors 230, 231 is connected to the negative input of a operational amplifier 224 and the output of the amplifier 224 is fed to the gate of the MOSFET 228. The positive input of the amplifier 224 is connected to the nodal point 237 in the string of series resistors $R_1$–$R_{N-1}$. Thus, the nodal point 237 is maintained at a selected voltage level which serves as a reference described fully hereinafter. The resistors 230 and 231 have the same temperature coefficients.

Resistors 232 and 233 have different temperature coefficients one from the other, and serve as the ambient temperature sensors in this device. The temperature sensitive resistors 233 is connected across the power source in series with a parallel array of MOSFETS $C_1$–$C_M$. Each of these MOSFETS has a different resistance characteristic determined by the channel width-/length ratio. Further, whether each MOSFET $C_1$–$C_M$ is turned on or off is determined by the contents written in a programmable read only memory (PROM) 223. The memory 223 is programmed to adjust for variations in the values of the integrated resistors 232–233 which result from production variability and which if not adjusted by means of the MOSFETS $C_1$–$C_M$ would provide erroneous temperature indications in relation to a design temperature value.

In other words, after the PROM 223 is initially set, the temperature set resistor 233 is in series with a resistance comprised of the selected MOSFETS of $C_1$–$C_M$. The analogue temperature signal representative of ambient temperature is detected at the nodal point 239 associated with the temperature sensitive resistor 233. This signal at the nodal point 239 is inputted to the comparator 226 for purposes as previously described.

As described above, a set-reset circuit comprised of NAND gates 234–236 detects a reversal in the output of the comparator 226 and terminates the count of the counter 221. Accordingly, the count in the counter 221 at the time counting is stopped is representative of the temperature sensed at the nodal point 239. That is, a different ambient temperature changes the voltage at point 239 and a different count of the counter 221 is reached which causes the comparator output to switch over.

Figure 13:
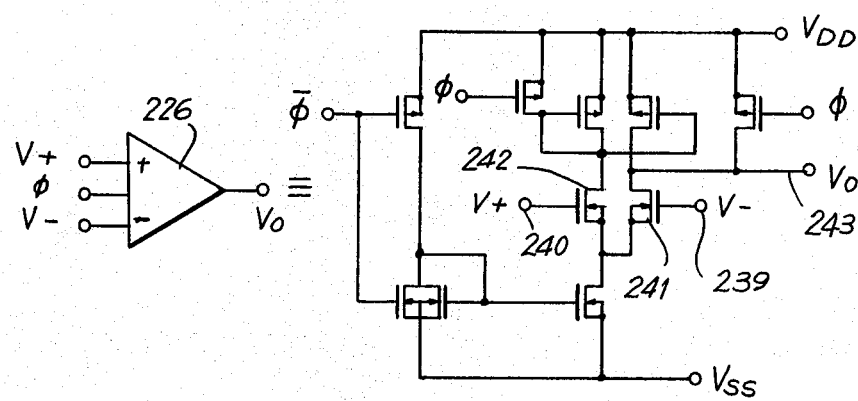
FIG. 13 is a comparator circuit using MOSFETS and suited to the circuit of FIG. 11.
Figure 14:
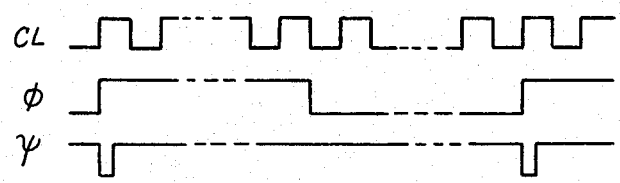
FIG. 14 shows timing wave forms associated with the circuits of FIGS. 12 and 13.

FIG. 13 is an exemplary CMOS circuit of the comparator 226. The signals at the nodal points 239, 240 of the detector circuit are applied to the gates of the MOSFETS 241, 242 respectively. The output terminal 243 (Vo) of the comparator is input to the NAND gate 234. FIG. 14 shows waveforms applied to the circuits of FIGS. 12, 13. The signal $\psi$ applied to the NAND gate 235 restarts the counting cycle of the counter 221 at regular intervals, as desired for the application, e.g. adjusting a timepiece.

As described, in FIG. 12 there is means for providing an initial adjustment to the temperature sensitive resistor circuit 204 (FIG. 11) so as to make the outputs from that portion of the temperature detector correspond to desired design values. However, when such a temperature detector circuit in accordance with this invention is used in conjunction with an electronic timepiece, certain other detector difficulties can arise in relation to manufacturing variations in the elements of the timepiece circuitry.

Figure 15:
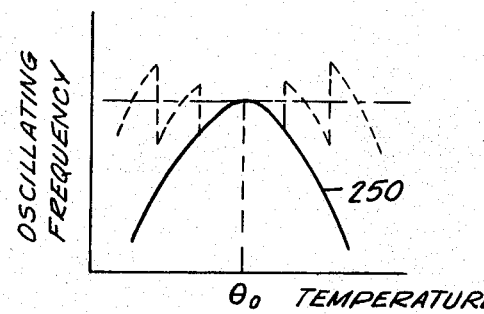
FIG. 15 is a graph of the frequency-temperature characteristics of a quartz crystal oscillator.

Generally, a tuning fork type crystal vibrator is used in the timepiece oscillator 201. A vibrator of this type has a frequency-temperature characteristic as shown by the parabolic curve 250, that is the solid line in FIG. 15. In FIG. 15, $\theta_0$ shows a temperature corresponding to the peak point of the parabolic curve. Hereafter, $\theta_0$ is referred to as the maximum temperature. It is desirable that the maximum temperature correspond to the design oscillating frequency of the vibrator. When the actual tuning fork type vibrator has a characteristic as shown in the solid line of FIG. 15, then there is little difficulty (FIG. 11) to store division ratio data in the memory within the functional block 208 such that timekeeping deviations due to temperature changes can be readily corrected. However, a problem arises in that incorrect ratio signals will be applied to the divider 202 if it is assumed in storing correction data in the memory 208 that the vibrator has the design maximum temperature $\theta_0$ of FIG. 15 when, in fact, the temperature dependence of the actual quartz crystal, and especially the peak temperature, differ from the design values.

Tuning fork type quartz crystal vibrators as presently made in mass production show temperature variations of $\pm 4°$ C. in the peak temperature. Thus, there is a great problem if signals are to be applied to the divider 202 to regulate the time for accuracy. The circuits in accordance with this invention are designed for adjustment to the variations of the peak temperatures $\theta$ and to reduce the errors in timing regulation to a small value.

Figure 17:
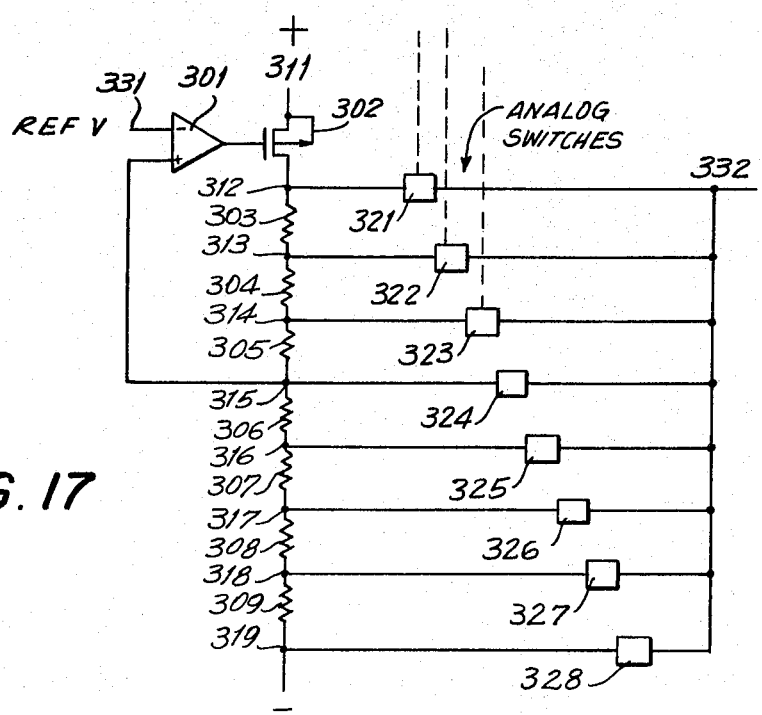
FIG. 17 is a circuit similar to that of FIG. 2.

In particular, adjustments are made in the functional block 205 (FIG. 11) to compensate for variations in the peak temperature of the tuning fork vibrator. FIG. 17 shows a portion of the circuit of the functional block 205 of FIG. 11. In FIG. 17, seven nodal points 312–318 are provided for supplying incremental levels of voltage to the comparator 206 in response to a counter and decoder as previously described. The series resistors 303 and 309 are integrated resistors and terminal 311 is connected to the positive terminal of a DC power source and terminal 319 is connected to the negative terminal of the DC power source. Analogue switches 321–328, for example, transmission gates or transfer gates, are connected to the nodal points and are turned on one by one by the count of a counter in the functional block 205 of FIG. 11 as previously described. A reference voltage signal is applied at input terminal 331 of an operational amplifier 301 having its output applied to the gate of a MOSFET transistor 302 which is in series with the string of resistors 303–309. The other input to the operational amplifier 301 is connected to the nodal point 315 and accordingly the reference voltage 331 is transmitted to the nodal point 315.

Step by step, by operation of a counter/decoder circuit e.g. 221, 222, incremental levels of voltage corresponding to the voltage at the selected nodal points, that is from the nodal points 312–319, are presented at the output nodal point 332. This signal 332 is then transmitted to the input of the comparator 206 (FIG. 11).

The incremental level of voltage at the nodal points 312–319 respectively correspond to a predetermined temperature. For example, the nodal point 312 indicates 43° C., the nodal point 313 indicates 37° C., the nodal point 314 indicates 31° C., the nodal point 315 indicates 25° C., the nodal point 316 indicates 19° C., the nodal 317 indicates 13° C. and the nodal point 318 indicates 7° C. Note that the reference voltage at the nodal point 315 corresponds to 25° C. Further in the example, assume that the design peak temperature of the frequency-temperature characteristic of the tuning fork crystal vibrator is at 25° C. Accordingly, it is desired for a perfect vibrator having its peak temperature at 25° C. that no corrections be made in the divider network 202 when the ambient temperature is 25° C. The contents of the memory associated with the functional block 205 (FIG. 11) would provide no adjustment to the divider network 202 when the ambient is 25° C. for the perfect tuning fork vibrator. However, the memory portion 208 would store data appropriate to deviations from the ambient of 25° C. in accordance with the parabolic curve as illustrated by the solid line of FIG. 15.

In the example at 25° C., the counter would be stopped when the switch 324, connected to the nodal point 315, is closed. However, if the ambient temperature were 19° C., the counter would be stopped when the voltage at nodal point 316 was detected by closing of the switch 325, and so on.

As stated above, mass produced quartz crystal vibrators have peak temperatures varying by plus or minus four degrees around the design value. When the peak temperature of the vibrator is different from the design value, and data is written into the memory portion of the functional block 208 in anticipation of a vibrator operating at design value, errors in timing regulation will occur if no adjustments are made. With reference to FIG. 15, the design value of peak temperature is $\theta_0$. And the solid line shows the frequency-temperature characteristic of a vibrator operating at design values. That is, the solid line shows the frequency-temperature characteristic without any regulation. The broken line of FIG. 15 shows a frequency-temperature characteristic after the application of logical regulation produced by a circuit as shown by FIG. 11. The improvement in accuracy is apparent.

Figure 16:
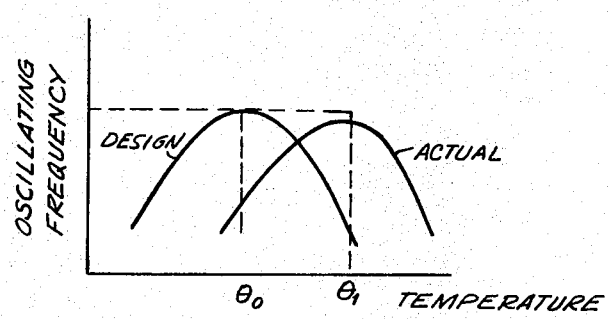
FIG. 16 is similar to FIG. 15 and shows production variations in the frequency-temperature characteristics.

Assume that the actual peak temperature of a quartz crystal vibrator is $\theta_1$ where $\theta_1$, does not equal $\theta_0$. Such a case is illustrated in FIG. 16 where the design characteristic having a peak temperature $\theta_0$ is shown adjacent an actual value characteristic having a peak temperature of $\theta_1$. It is apparent that temperature adjustment will be required in the divider network 202 in using the actual vibrator. However, because the memory portion of the functional block 208 is programmed on the basis of a vibrator which has its peak temperature at $\theta_0$, undesired corrections would be made when using circuitry as shown in FIG. 17. For example, when the ambient temperature is 25° the actual vibrator would require correction to the divider 202 whereas the memory of circuit block 208 would provide for no correction.

In order to compensate for these variations in the peak temperature of the tuning fork vibrators, it is necessary to shift incrementally the voltage levels outputted at the terminal 332 of FIG. 17 for the step by step closing of the switches 321–328. In the previous example, it was stated that the voltage at the nodal point 315 represented 25° C., which was the design temperature for a perfectly formed crystal vibrator. When an actual quartz crystal vibrator deviates from the design value, such that it has a peak temperature of 27° C. it is desired that the nodal point 315 correspond to 27° C. In such a case the nodal points 312–318 correspond to 45°, 39°, 33°, 27°, 21°, 15° and 9° C. respectively.

Figure 19:
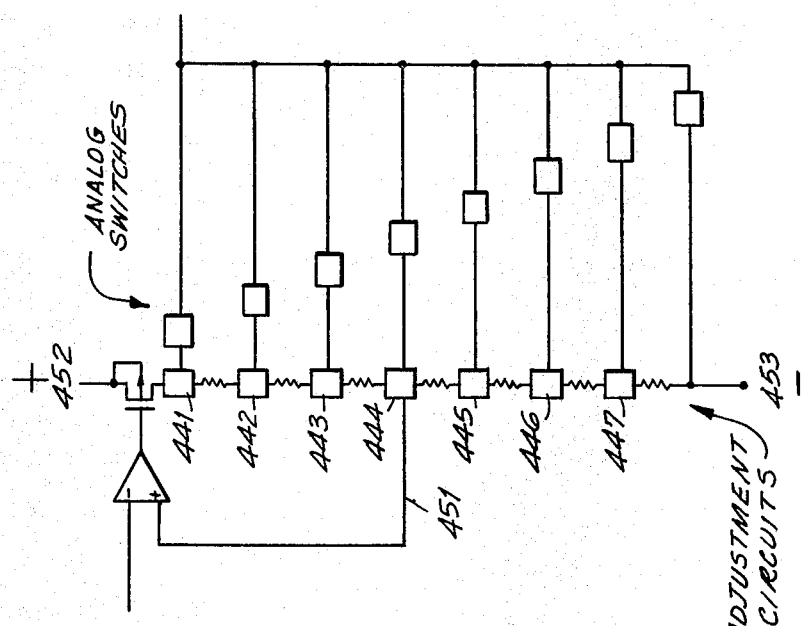
FIG. 19 is a functional circuit showing a combination of the circuits of FIGS. 17 and 18.
Figure 18:
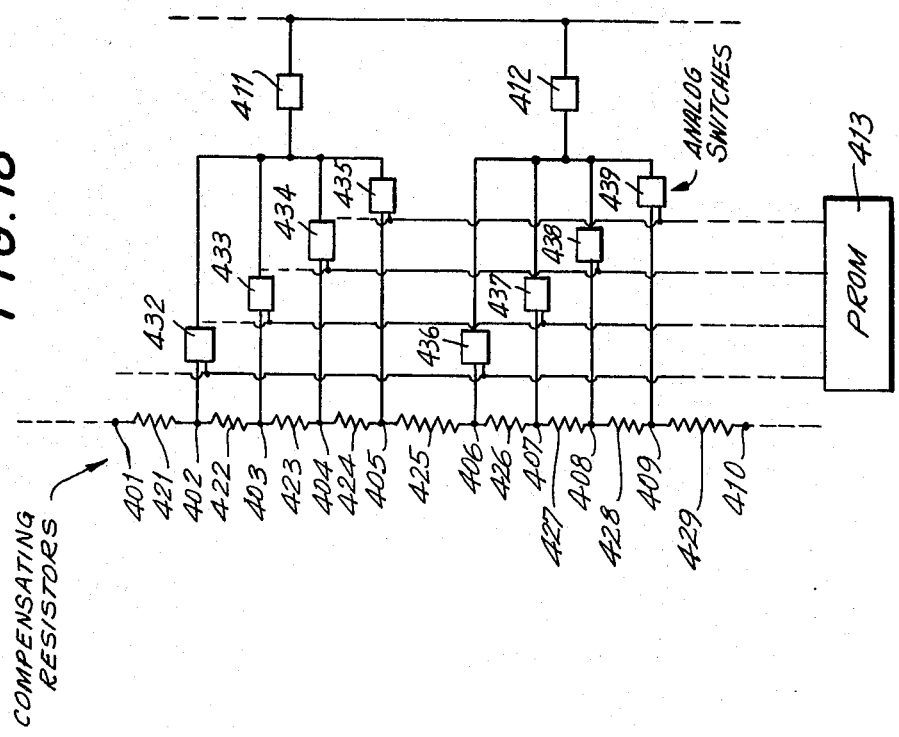
FIG. 18 shows details of an adjustment circuit for the circuit of FIG. 17.

FIGS. 18 and 19 show circuits for adjusting for peak temperatures which deviate from the design value. In this example a quartz crystal is adjusted for four possible peak temperatures, such as, 21°, 23°, 25° and 27° C. In FIG. 18, analogue switches 411, 412 operate so that successively, one at a time they are turned on in synchronism with the count of the counter within the functional block 205 of FIG. 11. Analogue switches 411, 412 connect to the switches 321–328 of FIG. 17. The series resistors 422–424 and 426–428 are used for adjusting for variations in the peak temperature of the vibrator. The nodal points 402–405 and 406–409 are located intermediate these resistors and are used for compensating for variations in the peak temperatures. These nodal points correspond to one nodal point in FIG. 17, that is, for example, the nodal points 402–405 correspond to nodal point 312 of FIG. 17.

Analogue switches 432–435 and 436–439, for example, a transmission or a transfer gate, are also used for compensating for peak temperature variations. The analogue switches 432–439 are selected to be connected in pairs, such as gates 432, 436, pair 433, 437, pair 434, 438 and as a pair 435, 439. These pairs are selected in accordance with the difference between the actual value and the design value of the peak temperature of the tuning fork vibrator. A programmable read only memory (PROM) is used for selecting the pairs of analogue switches to be connected in accordance with the actual peak temperature of the quartz crystal vibrator which is used.

It should be noted that when the peak temperature is classified in four catagories as shown by the embodiment of FIG. 18, the number of bits required of the PROM is 2. In general, when the peak temperature is classified in catagories of $2^{n-1}$ through $2^n$, the number of bits of PROM which is required is n.

FIG. 19 is an embodiment of the circuit block 205 of FIG. 11 constructed by using the circuits for adjusting the peak temperature shown in FIG. 18. In FIG. 19, terminal 452 is connected to a positive DC power source and terminal 453 is connected to the negative terminal of the DC power source. Functional blocks 441-447 are circuits of FIG. 18 for adjusting for a deviant value of peak temperature in the frequency temperature characteristic of the actual tuning fork crystal vibrator. The nodal point 451 is connected, using a reference voltage as described above in relation to FIG. 12, to a nodal point suitable to the design temperature value $\theta_0$ of the peak temperature. In FIGS. 17 and 19, P type MOSFETS are used. A N type of MOSFET may be used in this invention by connecting the positive terminal of the power source and the negative terminal of the power source in the opposite way.

The circuit of FIGS. 18 and 19 remarkably decreases the errors caused by a variation in the peak temperature of the quartz crystal oscillator. In summarizing, the resistances in the variable resistor circuits 205 are initially selected such that a desired nodal point in the string of series resistances represents the nominal design temperature. The resistances are then adjusted once and fixed by a PROM for deviations in the peak temperature of the actual tuning fork crystal vibrator.

The value of the temperature sensitive resistance 233 (FIG. 12) is initially adjusted to give a desired output at the design temperature. For example, if a crystal vibrator has its peak temperature at the design temperature of 25° C., the value of the resistance circuit including temperature sensitive resistor 233 is adjusted by programming the PROM 223 such that at 25° C. there is no correction made in the ratio of the divider network 202. If on the other hand, the vibrator has a peak temperature of 27° rather than the design value of 25° C., then the resistances in the circuit block 205 are adjusted by means of a plurality of PROMS 413 such that at 27° there will be no ratio adjustment to the divider network 202. The circuit (205) of FIG. 19 would require seven PROMS used as shown in FIG. 18.

As previously stated, every component of this temperature detector, whether temperature sensitive or temperature independent, is formed by integrated circuit techniques as part of the same substrate. This substrate can be the same substrate used for the circuits of, for example, an electronic timepiece.

In summary, a temperature detector integrated circuit in accordance with this invention, when combined with an electronic timepiece, includes a circuit for detecting the surrounding temperature. Also included is a circuit for converting the analog temperature signal to a digital signal, a memory circuit for storing data of the required timing regulation corresponding to the frequency-temperature dependence of the quartz crystal vibrator in the timepiece. Also included is a circuit arrangement for adjusting for manufacturing variations in the temperature sensing element and a circuit for inputting the temperature data to the automatic regulation circuits of the timepiece such that timing accuracy of an extremely high level is achieved. Ambient temperature is sensed by using integrated resistors having two different resistance coefficients. These temperature sensitive resistors are made to have different temperature coefficients, by methods such as changing the impurity density, changing the diffused depth of the impurity, or by changing the material of which the resistor is made. Further, production variations in the manufacture of the quartz crystal vibrator of the timepiece are compensated for by initial adjustments using an involatile memory element. Temperature variations in timekeeping are compensated with high accuracy and with low electric energy consumption. Temperature detector circuits in accordance with this invention are small in size and can be manufactured at a low cost because of the integrated techniques of construction.

It will thus be seen that the objects set forth above, among these made apparent from the preceding description, are efficiently attained and, since changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A temperature detector circuit comprising:
    comparator means having a first and second input and an output, a differential signal of one polarity across said inputs producing one state of signal at said output, a differential signal of the opposite polarity across said inputs producing an opposite state of signal at said output;
    a power source;
    a first resistance means including a first resistor connected across said power source, said first resistor being temperature insensitive, an output nodal point of said first resistance means being connected to said first input of said comparator means, said first resistance means including means for varying the voltage at said nodal point;
    second resistance means including at least one second resistor connected across said power source, the value of said at least one second resistor at a given temperature being independent of applied voltage and directly related to the length of said at least one second resistor and the resistivity $\rho$ of the material forming said at least one second resistor, and inversely proportional to the crossectional area thereof, a nodal point of said second resistance means being connected to said second input of said comparator means, at least a portion of said at least one second resistor being temperature sensitive, said differential signal input to said comparator being responsive to temperature;
    means for detecting a reversal in state at said comparator output, said means for detecting cooperating with said means for varying the voltage at said output nodal point of said first resistance means and terminating said variations of said voltage;
    temperature signal output means for indicating the condition at said output nodal point when said variations are terminated;
    different temperatures of said second resistance means resulting in different temperature signals from said temperature signal output means, said signals being indicative of said temperature at said second resistance means.

2. A temperature detector circuit as claimed in claim 1, wherein said means for varying the voltage at said output nodal point includes counter means, changing counts of said counter changing said voltage at said output nodal point of said first resistance means.

3. The temperature detector circuit as claimed in claim 2, wherein said means for detecting a reversal in state in said comparator output is adapted to terminate the counting of said counter when said reversal occurs.

4. The temperature detector circuit as claimed in claim 3, wherein said means for detecting a reversal in state of said comparator output includes a set-reset circuit, a reversal signal of said comparator output being applied to said set-reset circuit and causing the output of said set-reset circuit to reverse.

5. The temperature detector circuit of claim 1, wherein said first resistor is tapped at a plurality of intermediate nodal points, and further comprising
switch means, said switch means being located between said intermediate nodal points and said output nodal point of said first resistance means, depending upon the condition of said switch means, said output nodal point sensing different levels of voltage from said first resistor.

6. The temperature detector circuit as claimed in claim 5, wherein said first resistance means further includes a counter, output signals from said counter causing said switch means to connect said intermediate nodal points in a sequence to said output nodal point of said first resistance means, the output voltage of said first resistance means varying incrementally in response to the change in count in said counter means.

7. The temperature detector circuit as claimed in claim 6, wherein said means for detecting a reversal in state of said comparator output is adapted to output a signal upon the occurrence of said reversal, said signal stopping the counting of said counter, the voltage at said output nodal point of said first resistance means being fixed when said comparator output reverses.

8. The temperature detector circuit as claimed in claim 7, wherein the temperature signal output means is adapted to indicate the condition at said nodal point of said first resistance means, said indication being an output signal representative of the count in said counter when counting is stopped.

9. The temperature detector circuit as claimed in claim 1 or 8, wherein said second resistance means includes at least two second resistors, two of said second resistors being sensitive to temperature and having different temperature coefficients.

10. The temperature detector circuit as claimed in claim 1 or 8, wherein said temperature detector circuit is combined with an electronic timepiece, said timepiece having an oscillator circuit including: a vibrator; a divider network; display means and timekeeping correction means, said temperature signal output means outputting signals to said timekeeping correction means.

11. The temperature detector circuit as claimed in claim 10, wherein said correction means alters the division ratio in said divider network of said timepiece, whereby the timekeeping rate is varied in response to the temperature of said second resistance means.

12. The temperature detector circuit as claimed in claim 10, wherein said first resistance means further includes a resistance between said power source terminals and means for modifying said resistance.

13. The temperature detector circuit as claimed in claim 12, wherein said means to modify said resistance includes programmable resistances, said programmable resistances being initially set to modify the voltages at said intermediate nodal points to compensate for a manufacturing deviation from the design values in the frequency-temperature characteristics of said vibrator.

14. A temperature detector circuit as claimed in claim 1, wherein said comparator means includes a MOSFET at said first input, said nodal point of said first resistance means being connected to the gate of said MOSFET, whereby current flow is minimized.

15. The temperature detector circuit as claimed in claim 5, wherein said comparator includes a MOSFET at said first input, said output nodal point of said first resistance means being connected to the gate of said MOSFET, whereby the current flow through said switch means is minimized.

16. The temperature detector circuit as claimed in claim 13, wherein said means to modify said resistance includes a programmable read-only memory.

17. A temperature detector circuit as claimed in claim 1, wherein at least a portion of said resistors in said first and second resistance means are integrated on a substrate, at least two of said integrated resistors having different temperature coefficients, at least one said integrated resistor in said first resistance means being substantially temperature insensitive and one said integrated resistor in said second resistance means being temperature dependent.

18. The temperature detector circuit as claimed in claim 17, wherein said temperature detector circuits are transistorized, said transistorized circuits being integrated on the same substrate as said integrated resistors.

19. The temperature detector circuit as claimed in claim 18, wherein said transistorized circuits include circuits for an electronic timepiece.

20. A temperature detector circuit for a timepiece comprising:
sensing circuit means including a first resistor, said first resistor being sensitive to temperature variations and adapted to sense temperature, said sensing circuit means outputting an analogue temperature signal;
means for converting said analogue temperature signal to digital signal, including a second resistor, said second resistor having a different temperature coefficient from said first resistor, said first and second resistors being integrated on a substrate, the value of at least said first resistor at a given temperature being independent of applied voltage and directly related to the length of said first resistor and the resistivity of the material forming said first resistor, and inversely proportional to the crossectional area thereof.

21. A temperature detector circuit as claimed in claims 17, 18, 20, wherein said resistors of different temperature coefficients are diffused resistors having different impurity densities.

22. A temperature detector circuit as claimed in claim 17, 18 or 20, wherein said resistors having different temperature coefficients are ion implanted resistors having different impurity densities.

23. A temperature detector circuit as claimed in claim 17, 18 or 20, wherein said resistors of different temperature coefficients are diffused resistors having different depths of impurity diffused therein.

24. The temperature detector circuit as claimed in claim 17, 18 or 20, wherein said resistors of different temperatures coefficients are polycrystalline silicon resistors.

25. The temperature detector circuit as claimed in claim 18, wherein said transistorized circuits include said comparator means, said first resistance means, said second resistance means, said means for detecting a reversal, said transistorized circuits including MOS-FETS.

26. The temperature detector circuit as claimed in claim 1, wherein said first resistance means includes means for initial adjustment to compensate for manufacturing variances.

27. The temperature detector circuit as claimed in claim 1 or 26, wherein said second resistance means includes means for initial adjustment to compensate for manufacturing variances.

28. The temperature detector circuit as claimed in claim 1, wherein said temperature detector circuit includes a bridge circuit.

29. The temperature detector circuit as claimed in claim 28, wherein said first resistance means forms at least a portion of one branch of said bridge circuit, said second resistance means forms at least a portion of a second branch of said bridge circuit, said comparator means detecting the imbalance of voltage between said first and second branches.

30. A temperature detector circuit comprising:
comparator means having a first and second input and an output, a differential signal of one polarity across said inputs producing one state of signal at said output, a differential signal of the opposite polarity across said inputs producing an opposite state of signal at said output;
a power source;
a first resistance means including a resistance between the terminals of said power source and means for modifying said resistance, and a first resistor connected across said power source, said first resistor being temperature insensitive, an output nodal point of said first resistance means being connected to said first input of said comparator means, said first resistance means including means for varying the voltage at said nodal point, said means for modifying said resistance includes programmable resistances, said programmable resistances being initially set to modify the voltages at said intermediate nodal points to compensate for a manufacturing deviation from the design values in the frequency-temperature characteristics of said vibrator;
second resistance means including at least one second resistor connected across said power source, a nodal point of said second resistance means being connected to said second input of said comparator means, at least a portion of said at least one second resistor being temperature sensitive, said differential signal input to said comparator being responsive to temperture;
means for detecting a reversal in state at said comparator output, said means for detecting cooperating with said means for varying the voltage at said output nodal point of said first resistance means and terminating said variations of said voltage;
temperature signal output means for indicating the condition at said output nodal point when said variations are terminated;
different temperatures of said second resistance means resulting in different temperature signals from said temperature signal output means, said signals being indicative of said temperature at said second resistance means.

31. The temperature detector circuit as claimed in claim 30 wherein said frequency-temperature characteristic deviations are separated into ranges, the number of said programmable resistances at each intermediate nodal point at least equaling the number of said ranges.

32. The temperature detector circuit as claimed in claim 10 wherein said vibrator is a tuning fork type vibrator having a parabolic frequency-temperature characteristic.

33. The temperature detector circuit as claimed in claim 30, wherein said vibrator is a tuning fork type vibrator having a parabolic frequency-temperature characteristic and said deviation is a difference in peak temperature between actual and design values.

34. A temperature detector circuit comprising:
comparator means having a first and second input and an output, a differential signal of one polarity across said inputs producing one state of signal at said output, a differential signal of the opposite polarity across said inputs producing an opposite state of signal at said output;
a power source;
a first resistance means including a first resistor connected across said power source, said first resistor being temperature insensitive, an output nodal point of said first resistance means being connected to said first input of said comparator means, said first resistance means including means for varying the voltage at said nodal point;
second resistance means including at least two second resistors connected across said power source, a nodal point of said second resistance means being connected to said second input of said comparator means, two of said at least two second resistors being temperature sensitive and having different temperature coefficients, said differential signal input to said comparator being responsive to temperature;
means for detecting a reversal in state at said comparator output, said means for detecting cooperating with said means for varying the voltage at said output nodal point of said first resistance means and terminating said variations of said voltage;
temperature signal output means for indicating the condition at said output nodal point when said variations are terminated;
different temperatures of said second resistance means resulting in different temperature signals from said temperature signal output means, said signals being indicative of said temperature at said second resistance means.
a power source.

35. The temperature detector circuit as claimed in claim 34, wherein said second resistance means includes a portion insensitive to temperature and cooperating with said temperature sensitive resistors, said insensitive portion being set initially to compensate for manufacturing deviations from design values in the magnitudes of said temperature sensitive resistors.

36. The temperature detector circuit as claimed in claim 35, wherein said insensitive portion in said second resistance means includes a temperature insensitive resistive element the magnitude of said resistive element being initially set by a programmable read-only memory circuit.

* * * * *